(12) United States Patent
Suzuki et al.

(10) Patent No.: US 12,085,710 B2
(45) Date of Patent: *Sep. 10, 2024

(54) ACTUATOR DEVICE

(71) Applicant: HAMAMATSU PHOTONICS K.K., Hamamatsu (JP)

(72) Inventors: Daiki Suzuki, Hamamatsu (JP); Yuki Morinaga, Hamamatsu (JP); Go Tanaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,266

(22) Filed: Apr. 24, 2023

(65) Prior Publication Data

US 2023/0341676 A1    Oct. 26, 2023

Related U.S. Application Data

(63) Continuation of application No. 17/512,045, filed on Oct. 27, 2021, now Pat. No. 11,675,185, which is a
(Continued)

(30) Foreign Application Priority Data

Jul. 21, 2017   (JP) .................................. 2017-142163

(51) Int. Cl.
  *G02B 26/08*   (2006.01)
  *B81B 3/00*    (2006.01)
  *G02B 26/10*   (2006.01)

(52) U.S. Cl.
  CPC .......... *G02B 26/085* (2013.01); *B81B 3/0075* (2013.01); *G02B 26/10* (2013.01); *B81B 2201/042* (2013.01)

(58) Field of Classification Search
  CPC .... G02B 26/085; G02B 26/10; G02B 26/105; B81B 3/0075; B81B 2201/042;
  (Continued)

(56) References Cited

U.S. PATENT DOCUMENTS 11,199,695 B2 *  12/2021  Suzuki .................... B81B 3/00
11,675,185 B2 *   6/2023  Suzuki ................ G02B 26/085
                                                              359/221.2
2001/0022682 A1   9/2001  McClelland et al.
(Continued)

FOREIGN PATENT DOCUMENTS

CN   101279708 A   10/2008
CN   102422521 A    4/2012
(Continued)

OTHER PUBLICATIONS

Lilac Muller et al., "Microgimbal Torsion Beam Design Using Open, Thin-Walled Cross Sections", Journal of Microelectromechanical Systems, IEEE Service Center, US, vol. 10, No. 4, Dec. 1, 2001, XP011034670.
(Continued)

*Primary Examiner* — Euncha P Cherry
(74) *Attorney, Agent, or Firm* — Faegre Drinker Biddle & Reath LLP

(57) ABSTRACT

An actuator device includes: a support portion; a movable portion; a first connection portion connecting the movable portion to the support portion on a first axis so that the movable portion is swingable around the first axis; and a first wiring provided on the first connection portion. The first wiring includes a first main body formed of a metal material having a Vickers hardness of 50 HV or more. The first main body includes a first surface facing the first connection portion and a second surface other than the first surface. The second surface has a shape in which a curvature is continu-
(Continued)

ous over the entire second surface in a cross-section perpendicular to an extension direction of the first wiring.

13 Claims, 11 Drawing Sheets

Related U.S. Application Data continuation of application No. 16/631,259, filed as application No. PCT/JP2018/023138 on Jun. 18, 2018, now Pat. No. 11,199,695.

(58) Field of Classification Search
CPC ........... B81B 3/00; B81B 7/02; B81B 7/0009; B81B 2201/03; B81B 3/0008
See application file for complete search history.

(56) References Cited

U.S. PATENT DOCUMENTS

| | | | |
|---|---|---|---|
| 2007/0158104 A1 | 7/2007 | Fujinami et al. | |
| 2010/0259806 A1 | 10/2010 | Tauscher et al. | |
| 2016/0105090 A1 | 4/2016 | Sadaharu et al. | |
| 2020/0241407 A1* | 7/2020 | Wang | G02B 26/0866 |

FOREIGN PATENT DOCUMENTS

| | | |
|---|---|---|
| CN | 105934698 A | 9/2016 |
| JP | H08-186975 A | 7/1996 |
| JP | 2001-264677 A | 9/2001 |
| JP | 2007-030090 A | 2/2007 |
| JP | 2009-251002 A | 10/2009 |
| JP | 2013-035081 A | 2/2013 |
| JP | 2014-182189 A | 9/2014 |
| JP | 2014-186320 A | 10/2014 |
| JP | 2015-031786 A | 2/2015 |
| JP | 2015-227900 A | 12/2015 |
| JP | 2016-194630 A | 11/2016 |
| JP | 2016-219603 A | 12/2016 |
| JP | 2017-129783 A | 7/2017 |
| TW | 201007207 A | 2/2010 |

OTHER PUBLICATIONS

Xiao Dingbang et al., "A double differential torsional microaccelerometer based on V-shape beam", Sensors and Actuators A: Physical, Elsevier BV, NL, vol. 258, Mar. 11, 2017, p. 182-p. 192, XP029973426.

International Preliminary Report on Patentability mailed Jan. 30, 2020 for PCT/JP2018/023138.

Robert R. Archer et al., "An Introduction to the Mechanics of Solids", People's Education Press, Sep. 30, 1981, p. 191-p. 193, including Partial English-language translation.

Changjiyu Xuebing Yu, "Structural Modern Design for Heavy Truck", Dalian University of Technology Press, Apr. 30, 1998, p. 184-p. 186, including Partial English-language translation.

* cited by examiner

ACTUATOR DEVICE

TECHNICAL FIELD

An aspect of the invention relates to an actuator device configured as, for example, a micro electro mechanical systems (MEMS) device.

BACKGROUND ART

As an MEMS device, there is known an actuator device including a support portion, a movable portion, a connection portion connecting the movable portion to the support portion on an axis so that the movable portion is swingable around a predetermined axis, and a wiring provided on the connection portion. In such an actuator device, for example, the movable portion may swing at a high speed of a resonance frequency level (several kHz to several tens of kHz). For that reason, when metal such as aluminum or copper is used as a wiring material, there is a possibility of deterioration in controllability due to hysteresis behavior, work hardening, or the like, a change in characteristic with time, and the like. As a result, deterioration in characteristic, a disconnection, or the like occurs.

In order to solve the above-described problems, there is proposed a technique in which a diffusion layer is formed by diffusing impurities in a connection portion formed of a semiconductor material and the connection portion itself serves as a wiring (for example, see Patent Literature 1).

CITATION LIST

Patent Literature

Patent Literature 1: Japanese Unexamined Patent Publication No. H8-186975

SUMMARY OF INVENTION

Technical Problem

However, since the resistance of the diffusion layer is generally extremely higher than the resistance of the metal material, the above-described technique is not suitable for a case in which a relatively high current flows as in a case in which the movable portion swings at high speed with a large deflection angle. Here, in order to suppress the occurrence of metal fatigue while decreasing resistance, a method of forming the wiring of a metal material with high hardness is considered. However, there is concern that brittle fracture caused by stress concentration occurs in the wiring when the movable portion swings.

An object of an aspect of the invention is to provide an actuator device capable of improving reliability while decreasing a resistance of a wiring provided on a connection portion and suppressing a metal fatigue thereof.

Solution to Problem

An actuator device according to an aspect of the invention includes: a support portion; a movable portion; a first connection portion connecting the movable portion to the support portion on a first axis so that the movable portion is swingable around the first axis; and a first wiring provided on the first connection portion, in which the first wiring includes a first main body formed of a metal material having a Vickers hardness of 50 HV or more, in which the first main body includes a first surface facing the first connection portion and a second surface other than the first surface, and in which the second surface has a shape in which a curvature is continuous over the entire second surface in a cross-section perpendicular to an extension direction of the first wiring.

In the actuator device, the first wiring provided on the first connection portion includes the first main body formed of the metal material having a Vickers hardness of 50 HV or more. Accordingly, it is possible to decrease the resistance of the first wiring as compared with a case in which the entire first wiring is formed by the diffusion layer and to suppress a metal fatigue as compared with a case in which the entire first wiring is formed of a metal material having a Vickers hardness less than 50 HV. Further, the second surface of the first main body has a shape in which a curvature is continuous over the entire second surface in a cross-section perpendicular to the extension direction of the first wiring. Accordingly, since there is no point in which a curvature is discontinuous in the second surface, the occurrence of stress concentration is suppressed. As a result, it is possible to suppress the occurrence of brittle fracture in the first wiring. Particularly when the second surface has a point in which a curvature is discontinuous, the second surface is likely to be chipped or scratched in the process of manufacturing the actuator device or the like. Accordingly, there is a risk of stress concentration at a position where these occur. In the actuator device, since the second surface has a shape in which a curvature is continuous on the whole, the occurrence of stress concentration can be suppressed. Thus, according to the actuator device, it is possible to improve reliability while decreasing the resistance of the wiring provided on the connection portion and suppressing the metal fatigue thereof.

In the actuator device according to an aspect of the invention, the second surface may include a curved portion curved to protrude toward a side opposite to the first connection portion in a cross-section perpendicular to the extension direction of the first wiring. In this case, it is possible to further decrease the resistance of the first wiring by securing the cross-sectional area of the first wiring while suppressing the occurrence of brittle fracture in the first wiring.

In the actuator device according to an aspect of the invention, the second surface may intersect the first surface so as to form an acute angle in a cross-section perpendicular to the extension direction of the first wiring. In this case, it is possible to suppress stress concentration at the intersection portion between the second surface and the first surface and to further improve reliability.

In the actuator device according to an aspect of the invention, the first connection portion may be formed of a semiconductor material and a diffusion layer having impurities diffused therein may be formed in the first connection portion so as to contact the first wiring. In this case, since the diffusion layer serves as a part of the first wiring, the resistance of the first wiring can be further decreased.

In the actuator device according to an aspect of the invention, the first main body may be formed of at least one of tungsten, titanium, nickel, molybdenum, aluminum alloy, tungsten alloy, titanium alloy, nickel alloy, and stainless steel. In this case, the above-described effect that the reliability can be improved while decreasing the resistance of the wiring provided on the connection portion and suppressing the metal fatigue thereof can be suitably obtained.

In the actuator device according to an aspect of the invention, the first wiring may further include a seed layer provided between the first connection portion and the first main body. In this case, the adhesion of the first main body to the first connection portion can be improved.

In the actuator device according to an aspect of the invention, the seed layer may be formed of a metal material having a Vickers hardness of 50 HV or more. In this case, the occurrence of the metal fatigue and the brittle fracture of the seed layer can be suppressed.

The actuator device according to an aspect of the invention may further include a barrier layer provided between the first connection portion and the first wiring. In this case, even when a metal material to be easily diffused is contained in the first wiring, the diffusion of the metal material to the first connection portion can be suppressed.

In the actuator device according to an aspect of the invention, the barrier layer may be formed of a material having a Vickers hardness of 50 HV or more. In this case, the occurrence of the metal fatigue and the brittle fracture in the barrier layer can be suppressed.

The actuator device according to an aspect of the invention may further include a second wiring provided on the support portion and connected to the first wiring and the second wiring may be formed of a metal material having a Vickers hardness of less than 50 HV. In this case, for example, since the second wiring is formed of the metal material having a small specific resistance, the resistance of the second wiring provided on the support portion can be decreased.

The actuator device according to an aspect of the invention may further include a frame portion supporting the support portion and the movable portion; a second connection portion connecting the support portion to the frame portion on a second axis so that the support portion is swingable around the second axis intersecting the first axis; and a third wiring provided on the second connection portion, and the third wiring may include a second main body formed of a metal material having a specific resistance smaller than that of a metal material forming the first main body. In this case, the resistance of the third wiring provided on the second connection portion can be decreased.

The actuator device according to an aspect of the invention may further include: a frame portion supporting the support portion and the movable portion; a second connection portion connecting the support portion to the frame portion on a second axis so that the support portion is swingable around the second axis intersecting the first axis; and a third wiring provided on the second connection portion, the third wiring may include a second main body formed of a metal material having a Vickers hardness of 50 HV or more, the second main body may include a third surface facing the second connection portion and a fourth surface other than the third surface, and the fourth surface may have a shape in which a curvature is continuous over the entire fourth surface in a cross-section perpendicular to an extension direction of the third wiring. In this case, high reliability can be obtained while decreasing the resistance and suppressing the metal fatigue of the third wiring provided on the second connection portion.

The actuator device according to an aspect of the invention may further include a mirror provided in the movable portion. In this case, the mirror can be swung around the first axis to be used for light scanning or the like.

Advantageous Effects of Invention

According to an aspect of the invention, it is possible to provide an actuator device capable of improving reliability while decreasing a resistance of a wiring provided on a connection portion and suppressing a metal fatigue thereof.

DESCRIPTION OF EMBODIMENTS

Figure 1:
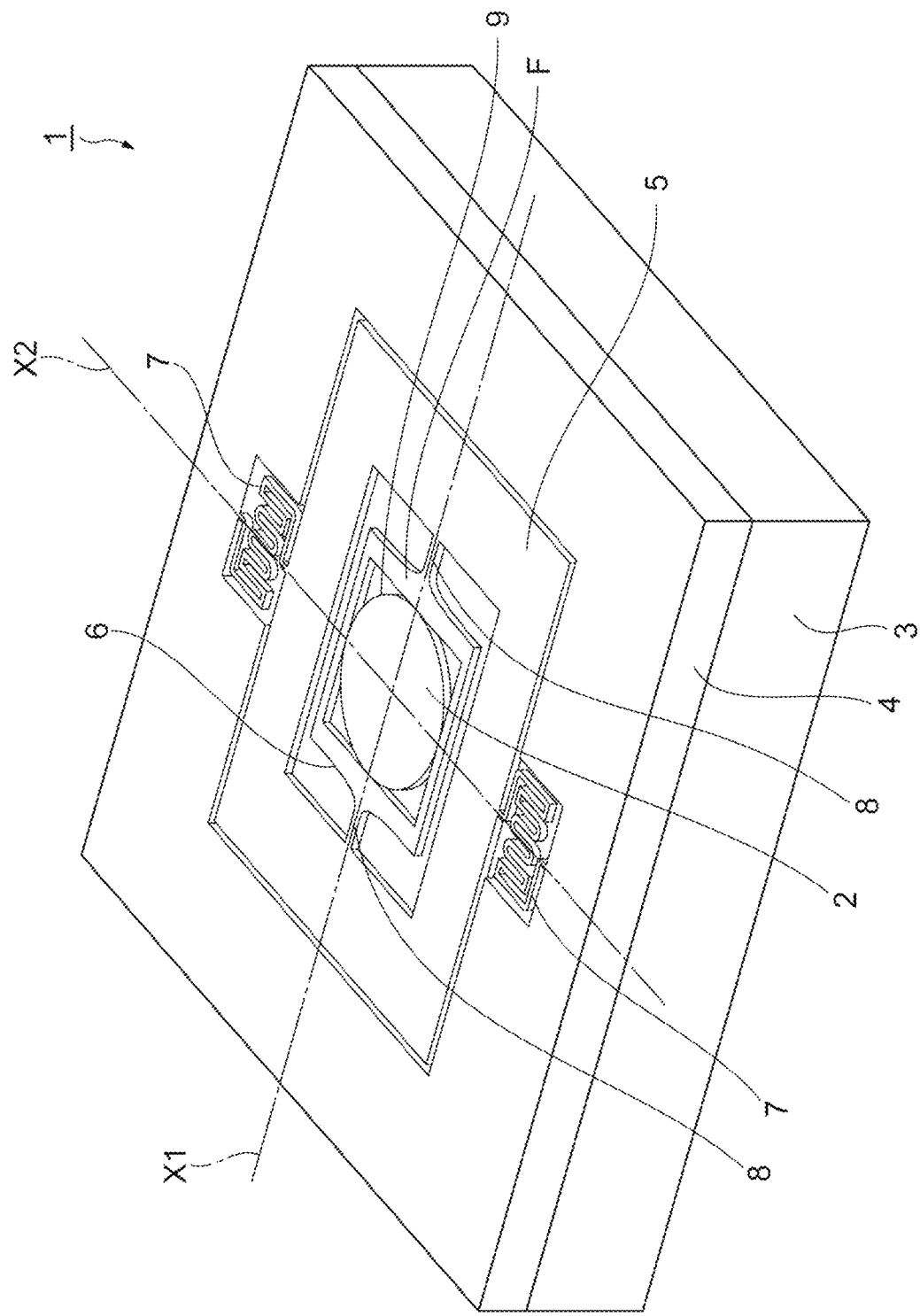
FIG. 1 is a perspective view illustrating an actuator device according to an embodiment.

Hereinafter, an embodiment according to an aspect of the invention will be described in detail with reference to the drawings. Additionally, in the description below, the same reference numerals will be given to the same or equivalent components and a redundant description thereof will be omitted.

Figure 2:
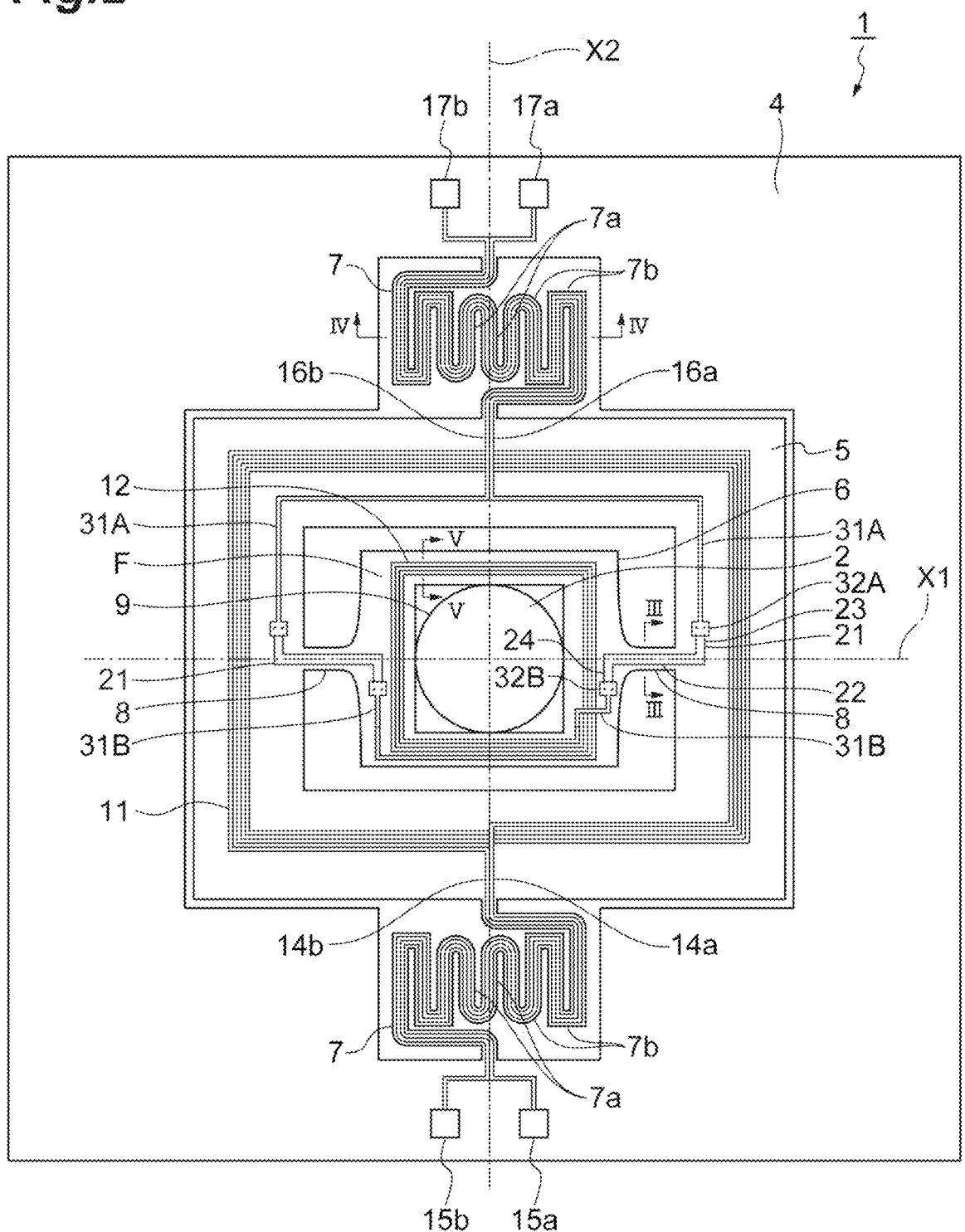
FIG. 2 is a plan view illustrating a circuit configuration of the actuator device illustrated in FIG. 1.

As illustrated in FIGS. 1 and 2, an actuator device 1 includes a mirror 2, a magnetic field generator 3, a frame portion 4, a support portion 5, a movable portion 6, a pair of second connection portions 7, and a pair of first connection portions 8. The actuator device 1 is configured as an MEMS device that swings the mirror 2 around each of a first axis X1 and a second axis X2 which are orthogonal to each other. Such an actuator device 1 is used in, for example, an optical communication switch or an optical scanner.

The mirror 2 is a light reflecting film which is formed by a metal film. The mirror 2 has a circular shape in plan view (when viewed from a direction orthogonal to a plane where at least the support portion 5, the movable portion 6, and the pair of first connection portions 8 are disposed). The metal material forming the mirror 2 is, for example, aluminum (Al), an aluminum alloy, gold (Au), silver (Ag), a silver alloy, or the like.

The magnetic field generator 3 is a rectangular flat plate having a pair of main surfaces. The magnetic field generator 3 applies a magnetic field to a coil 11 provided in the support portion 5 and a coil 12 provided in the movable portion 6 (the coils 11 and 12 will be described later). The magnetic field generator 3 is formed by, for example, a permanent magnet or the like. The arrangement of the magnetic poles in the magnetic field generator 3 is, for example, a Halbach arrangement.

The frame portion 4 is a frame portion having a rectangular flat plate shape in plan view. The frame portion 4 is disposed on one main surface of the magnetic field generator 3. The frame portion 4 supports the support portion 5, the movable portion 6, and the mirror 2 through the pair of second connection portions 7. Each second connection portion 7 connects the support portion 5 to the frame portion 4 on the second axis X2 so that the support portion 5 is swingable around the second axis X2. That is, each second connection portion 7 serves as a torsion bar. Each second connection portion 7 has a meandering shape in plan view in order to improve strength and easily adjust a torsion spring constant. More specifically, each second connection portion 7 extends in the direction of the second axis X2 and includes a plurality of linear portions 7a arranged in the direction of the first axis X1 and a plurality of folded portions 7b alternately connecting both ends of the plurality of linear portions 7a. The plurality of folded portions 7b include a folded portion extending in a linear shape and a folded portion extending while being curved in an R shape.

The support portion 5 is, for example, a frame portion having a rectangular flat plate shape in plan view and is located inside the frame portion 4. The support portion 5 is disposed so as to face one main surface of the magnetic field generator 3 and to be separated from one main surface of the magnetic field generator 3. The support portion 5 supports the movable portion 6, the mirror 2, and the like through the pair of first connection portions 8. Each first connection portion 8 connects the movable portion 6 to the support portion 5 on the first axis X1 so that the movable portion 6 is swingable around the first axis X1. That is, each first connection portion 8 serves as a torsion bar. Each first connection portion 8 is, for example, a flat plate member having a substantially rectangular shape in plan view and extends linearly along the first axis X1.

The movable portion 6 includes a frame F and an arrangement portion 9 and is located inside the support portion 5. The frame F is a frame portion having a rectangular flat plate shape in plan view and is connected to the first connection portion 8. The arrangement portion 9 is a circular flat plate in plan view, is disposed inside the frame F, and is connected to the frame F. The movable portion 6 is disposed so as to face one main surface of the magnetic field generator 3 and to be separated from one main surface of the magnetic field generator 3. The mirror 2 is disposed on the arrangement portion 9. That is, the mirror 2 is provided in the movable portion 6. The frame portion 4, the support portion 5, the movable portion 6, the pair of second connection portions 7, and the pair of first connection portions 8 are integrally formed of, for example, a semiconductor material such as silicon (Si). Additionally, in the example illustrated in FIG. 2, a gap is formed between the frame F and the arrangement portion 9, but the frame F and the arrangement portion 9 may be provided in series without any gap formed therebetween.

As illustrated in FIG. 2, the actuator device 1 further includes the coil 11 provided in the support portion 5 and the coil 12 provided in the movable portion 6. The coil 11 is embedded in the support portion 5 and the coil 12 is embedded in the movable portion 6. Each of the coils 11 and 12 is formed of, for example, a metal material such as copper (Cu). Additionally, in FIG. 2, each wiring is indicated by a solid line in order to facilitate the comprehension, but each of the wirings such as the coils 11 and 12 is actually covered by an insulation layer 51, an insulation layer 52, and/or an insulation layer 53 to be described later.

The coil 11 is wound a plurality of times in a spiral shape in plan view. One end of a wiring 14a is electrically connected to the inner end of the coil 11. One end of a wiring 14b is electrically connected to the outer end of the coil 11. Each of the wirings 14a and 14b is formed of a second metal material to be described later. Each of the wirings 14a and 14b is provided on one second connection portion 7 and extends from the support portion 5 to the frame portion 4. The other end of the wiring 14a is electrically connected to an electrode 15a provided in the support portion 5 and the other end of the wiring 14b is electrically connected to an electrode 15b provided in the support portion 5. Each of the electrodes 15a and 15b is electrically connected to a control circuit or the like. The wiring 14a three-dimensionally intersects the coil 11 so as to pass above the coil 11.

The coil 12 is wound a plurality of times in a spiral shape in plan view. One end of a wiring 16a is electrically connected to the inner end of the coil 12. One end of a wiring 16b is electrically connected to the outer end of the coil 12. Each of the wirings 16a and 16b is provided on the pair of first connection portions 8, the support portion 5, and the other second connection portion 7 and extends from the movable portion 6 to the frame portion 4. The other end of the wiring 16a is electrically connected to the electrode 17a provided in the support portion 5 and the other end of the wiring 16b is electrically connected to the electrode 17b provided in the support portion 5. Each of the electrodes 17a and 17b is electrically connected to a control circuit or the like. The wiring 16a three-dimensionally intersects the coil 12 so as to pass above the coil 12.

Each of the wirings 16a and 16b includes a first wiring 21 provided on each first connection portion 8 and second wirings 31A and 31B respectively provided on the support portion 5 and the movable portion 6.

The first wiring 21 is formed of a first metal material. The first wiring 21 is provided over the support portion 5, the first connection portion 8, and the movable portion 6. The first wiring 21 includes a first portion 22, a second portion 23, and a third portion 24. The first portion 22 extends along the first axis X1 on the support portion 5, the first connection portion 8, and the movable portion 6. The second portion 23 extends on the support portion 5 from an end on the side of the support portion 5 in the first portion 22 toward the other second connection portion 7. The third portion 24 extends on the movable portion 6 from an end on the side of the movable portion 6 in the first portion 22 toward one second connection portion 7. The extension direction of the first portion 22 intersects the extension direction of the second portion 23 and the extension direction of the first portion 22 intersects the extension direction of the third portion 24. The first wiring 21 is electrically connected to the second wiring 31A in the end on the support portion 5. The first wiring 21 is electrically connected to the second wiring 31B in the end on the movable portion 6.

The second wirings 31A and 31B are formed of a second metal material. One end of the second wiring 31A is electrically connected to the first wiring 21. The other end of the second wiring 31A is electrically connected to the electrode 17a. One end of the second wiring 31A is provided with a widened portion 32A which is wider than the other portion. The second wiring 31A is electrically connected to the first wiring 21 in the widened portion 32A. One end of the second wiring 31B is electrically connected to the first wiring 21. The other end of the second wiring 31B is electrically connected to the coil 12. One end of the second wiring 31B is provided with a widened portion 32B which is wider than the other portion. The second wiring 31B is electrically connected to the first wiring 21 in the widened portion 32B.

The Vickers hardness of the first metal material forming the first wiring 21 is 50 HV or more. The Vickers hardness is measured by the test method defined in JIS Z2244: 2009. The first metal material is, for example, at least one of tungsten (W), titanium (Ti), nickel, molybdenum (Mo), aluminum alloy, tungsten alloy, titanium alloy, nickel alloy, and stainless steel. Examples of aluminum alloy include duralumin. Stainless steel is an alloy containing 50% or more of iron (Fe) and 10.5% or more of chromium (Cr). The Vickers hardness of an alloy changes depending on its constituent materials. When the first metal material is an alloy, an alloy having a Vickers hardness of 50 HV or more is used as the first metal material. When the first metal material is nickel, titanium, tungsten, or duralumin, the Vickers harnesseses of the first metal materials are respectively 96 HV, 120 HV, 100 HV to 350 HV, and 115 HV to 128 HV. The Vickers hardness of the first metal material may be 500 HV or less.

The Vickers hardness of the second metal material forming the second wirings 31A and 31B is smaller than 50 HV. That is, the Vickers hardness of the second metal material is smaller than the Vickers hardness of the first metal material. In other words, the Vickers hardness of the first metal material is larger than the Vickers hardness of the second metal material. The second metal material is, for example, aluminum, copper, aluminum-copper alloy, aluminum-silicon-copper alloy, aluminum-silicon-titanium alloy, aluminum-silicon alloy, or aluminum-titanium alloy. When the second metal material is an alloy, an alloy having a Vickers hardness less than 50 HV is used as the second metal material. When the second metal material is aluminum and copper, the Vickers harnesseses of the second metal materials are respectively 25 HV and 46 HV. The metal material forming the second wiring 31A may be different from the metal material forming the second wiring 31B. The specific resistance of the second metal material may be smaller than the specific resistance of the first metal material. In other words, the specific resistance of the first metal material may be larger than the specific resistance of the second metal material. The metal material has a tendency that the specific resistance decreases as the Vickers hardness decreases.

In the embodiment, the specific resistance of the metal material forming the wiring (hereinafter, referred to as the third wiring) provided on each second connection portion 7 is smaller than the specific resistance of the first metal material. The third wiring corresponds to a portion located on the second connection portion 7 in the wirings 14a and 14b and a portion located on the second connection portion 7 in the second wirings 31A and 31B. As a composition of the metal material satisfying the above-described specific resistance relationship, for example, a composition in which the metal material forming the third wiring is aluminum, copper, aluminum-copper alloy, aluminum-silicon-copper alloy, aluminum-silicon-titanium alloy, aluminum-silicon alloy, or aluminum-titanium alloy and the first metal material is at least one of tungsten, titanium, nickel, molybdenum, aluminum alloy, tungsten alloy, titanium alloy, nickel alloy, and stainless steel can be exemplified. In the embodiment, the third wiring is formed as a part of the second wirings 31A and 31B, but the third wiring may be formed separately from the second wirings 31A and 31B and may be electrically connected to the second wirings 31A and 31B. In this case, the metal material forming the third wiring and the metal material forming the second wirings 31A and 31B may be different from each other. In the embodiment, the third wiring is formed as a part of the wirings 14a and 14b, but the third wiring may be formed separately from the wirings 14a and 14b and may be electrically connected to the wirings 14a and 14b. In this case, the metal material forming the third wiring may be different from the metal material forming the wirings 14a and 14b.

Figure 3:
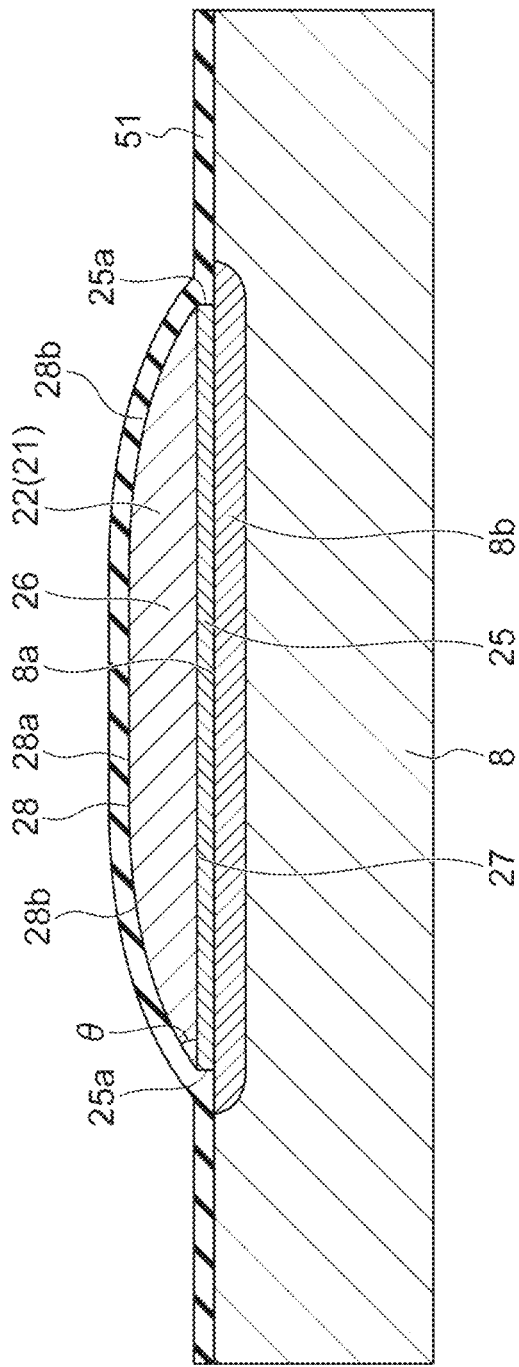
FIG. 3 is a partially cross-sectional view taken along line of FIG. 2.
Figure 4:
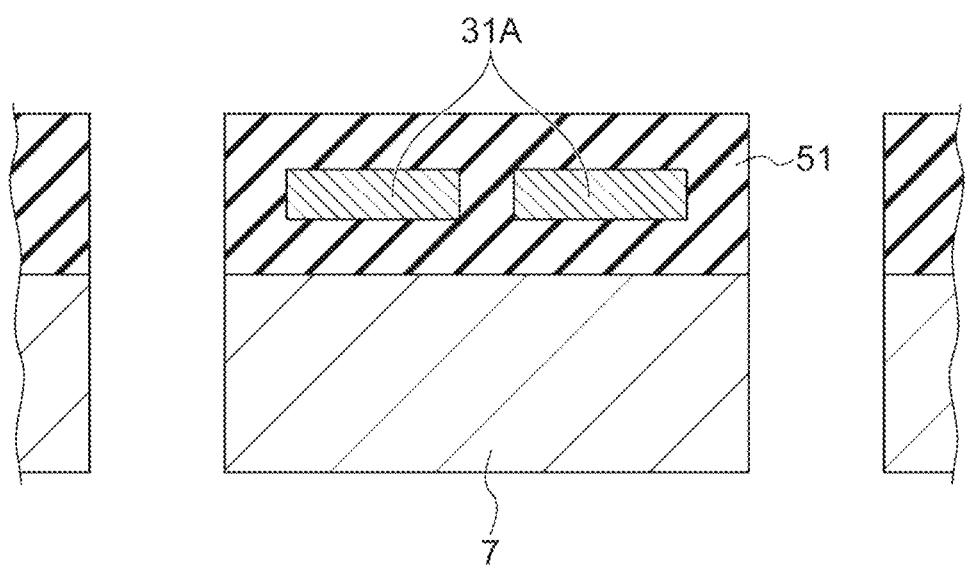
FIG. 4 is a partially cross-sectional view taken along line IV-IV of FIG. 3.
Figure 5:
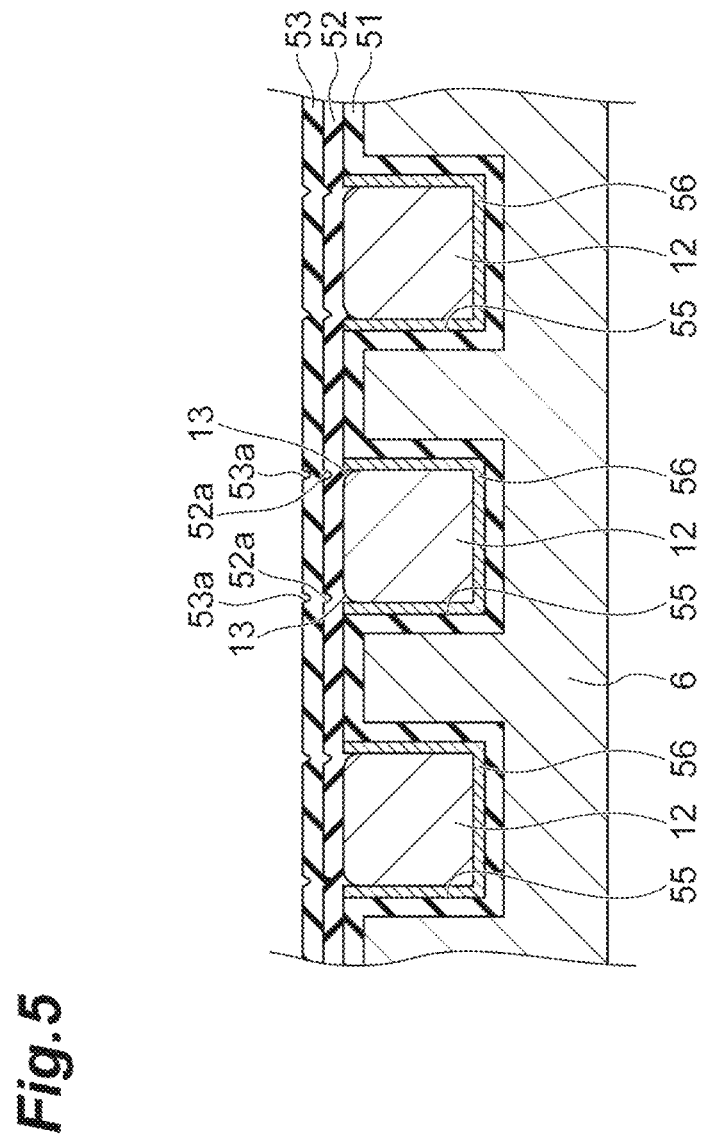
FIG. 5 is a partially cross-sectional view taken along line V-V of FIG. 3.

As illustrated in FIGS. 3 to 5, the actuator device 1 further includes insulation layers 51, 52, and 53. Each of the insulation layers 51, 52, and 53 is formed of, for example, silicon dioxide ($SiO_2$) or silicon nitride (SiN). The insulation layer 51 is provided on the surfaces of the frame portion 4, the support portion 5, the movable portion 6, the pair of second connection portions 7, and the pair of first connection portions 8. The insulation layers 52 and 53 are provided on the insulation layer 51 on the movable portion 6.

As illustrated in FIG. 3, the first portion 22 of the first wiring 21 is provided on a flat surface 8a of the first connection portion 8. That is, the first portion 22 (the first wiring 21) is placed on the surface 8a of the first connection portion 8. The first wiring 21 includes a seed layer 25 provided on the surface 8a and a first main body 26 provided on the seed layer 25. That is, the seed layer 25 is provided between the first connection portion 8 and the first main body 26. In this example, both of the seed layer 25 and the first main body 26 are formed of the first metal material. For example, the seed layer 25 is formed of titanium and the first main body 26 is formed of tungsten. The first main body 26 is a portion to which a current mainly flows in the first wiring 21 and which has the largest cross-sectional area. The first main body 26 is located at a position far from the first connection portion 8 in relation to the other portion of the first wiring 21 when viewed from a direction along the surface 8a of the first connection portion 8. The seed layer 25 has a function of improving the adhesion of the first main body 26 to the first connection portion 8 formed of silicon. The first main body 26 may be formed of nickel, molybdenum, aluminum alloy, tungsten alloy, titanium alloy, nickel alloy, or stainless steel. The seed layer 25 may be omitted and the first main body 26 may be directly provided on the surface 8a. In this case, the first main body 26 may be formed of tungsten, titanium, nickel, molybdenum, aluminum alloy, tungsten alloy, titanium alloy, nickel alloy, or stainless steel.

The first main body 26 of the first portion 22 includes a first surface 27 facing the first connection portion 8 and a second surface 28 other than the first surface 27. The first surface 27 faces the first connection portion 8 with the seed layer 25 interposed therebetween and is formed flat over the entire first surface 27. The second surface 28 has a shape in which a curvature is continuous over the entire second surface 28 in a cross-section (a cross-section illustrated in FIG. 3) perpendicular to the extension direction of the first portion 22 (a direction parallel to the first axis X1). In other words, there is no point in which a curvature is discontinuous on the second surface 28 in the cross-section. The point in which the curvature is discontinuous is, for example, an apex of a sharp corner (including acute, right, and obtuse angles). The second surface 28 includes a flat portion 28a which extends in parallel to the surface 8a and a pair of curved portions 28b which is continuous to both ends of the flat portion 28a and is curved so as to protrude toward a side opposite to the first connection portion 8 in the cross-section. Here, the curvature of the flat portion 28a (the linear portion) can be set to zero and the curvature at the boundary between the flat portion 28a and the curved portion 28b is continuous. The second surface 28 does not include a portion which is curved so as to protrude toward the first connection portion 8 in the cross-section and has a shape protruding toward a side opposite to the first connection portion 8 on the whole. The second surface 28 intersects the first surface 27 at the curved portion 28b. The second surface 28 intersects the first surface 27 so as to form an acute angle (an angle smaller than) 90° in the cross-section. An angle θ formed between the second surface 28 and the first surface 27 is, for example, about 45° or less. Here, the angle θ is an angle of an inner corner formed by the second surface 28 and the first surface 27. When the second surface 28 is curved at the intersection portion with the first surface 27 as in the embodiment, the angle θ is an angle of a corner formed by the first surface 27 and the tangent line at the intersection portion of the second surface 28.

The seed layer 25 of the first portion 22 includes a surface 25a connected to the second surface 28. The surface 25a extends, for example, in a direction substantially perpendicular to the surface 8a of the first connection portion 8. An angle formed by the surface 25a and the surface 8a (an angle of an inner corner formed by the surface 25a and the surface 8a) may be about 45° to 90°. In this way, when the angle of the corner formed by the surface 25a and the surface 8a is relatively large, the end on the side of the first connection portion 8 in the surface 25a is easily formed by etching as compared with a case in which the angle is small. Accordingly, the occurrence of stress concentration of the seed layer 25 can be suppressed.

The insulation layer 51 is provided to run on the first wiring 21. A diffusion layer 8b is formed in the entire area facing the first wiring 21 in the surface 8a of the first connection portion 8 so as to contact the first wiring 21. The diffusion layer 8b is formed over the support portion 5, the movable portion 6, and the first connection portion 8. The diffusion layer 8b is, for example, a diffusion region formed by diffusing p-type impurities on the surface of an n-type silicon substrate or a diffusion region formed by diffusing n-type impurities on the surface of a p-type silicon substrate.

The second portion 23 and the third portion 24 of the first wiring 21 also have the same layer configuration and cross-sectional shape as those of the first portion 22. That is, the top surface of the first main body 26 in the second portion 23 (the surface other than the surface facing the support portion 5) also has a shape in which a curvature is continuous over the entire top surface in a cross-section perpendicular to the extension direction of the second portion 23 (a direction parallel to the second axis X2). The top surface of the first main body 26 of the third portion 24 (the surface other than the surface facing the movable portion 6) also has a shape in which a curvature is continuous over the entire top surface in a cross-section perpendicular to the extension direction of the third portion 24 (a direction parallel to the second axis X2). In this way, the "cross-section perpendicular to the extension direction of the first wiring 21" means a cross-section perpendicular to the extension direction of each portion when the first wiring 21 includes a plurality of portions extending in different directions. In this example, the first wiring 21 has a constant cross-sectional shape along the extension direction.

Figure 6:
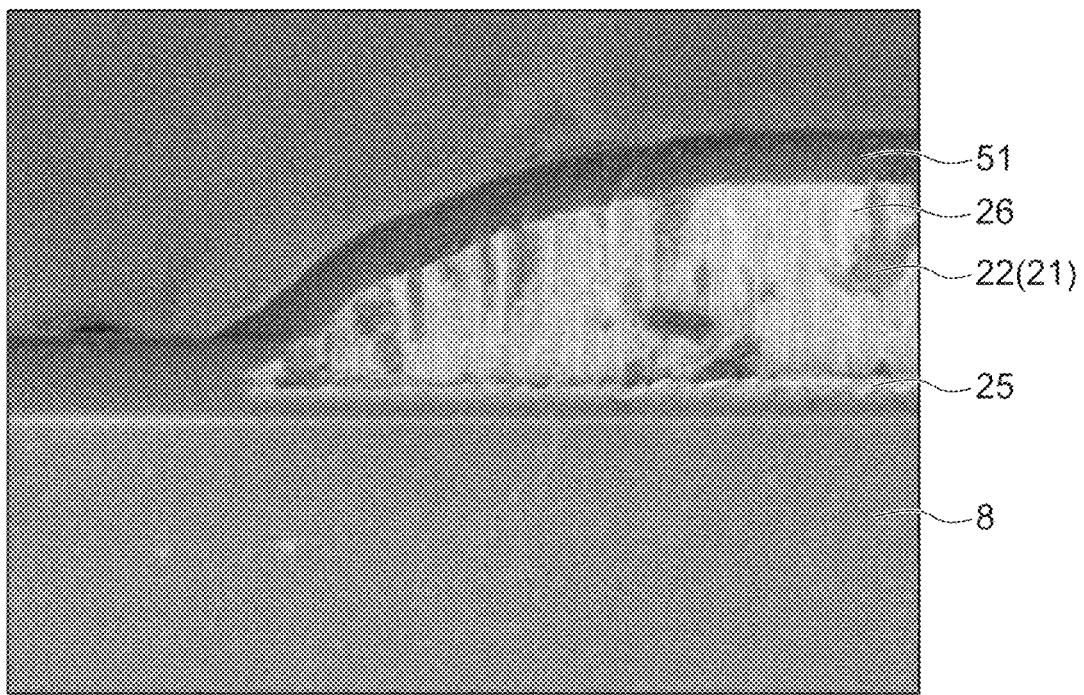
FIG. 6 is a photomicrograph showing a cross-section of a fabricated first wiring.
Figure 7A:
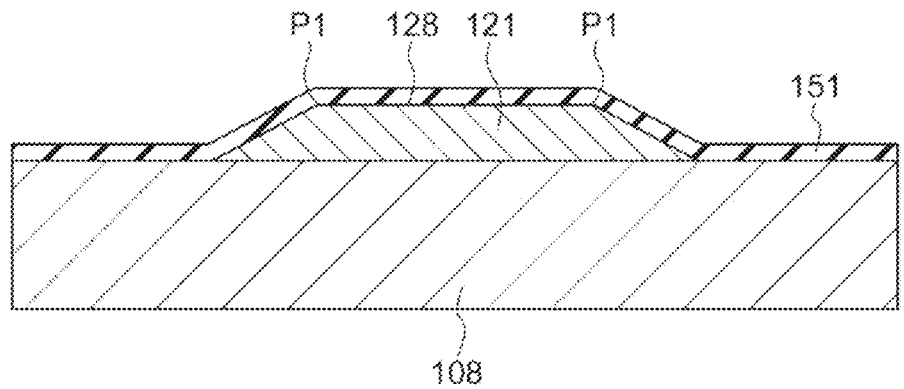
FIGS. 7A to 7C are schematic cross-sectional views of first to third comparative examples.
Figure 7B:
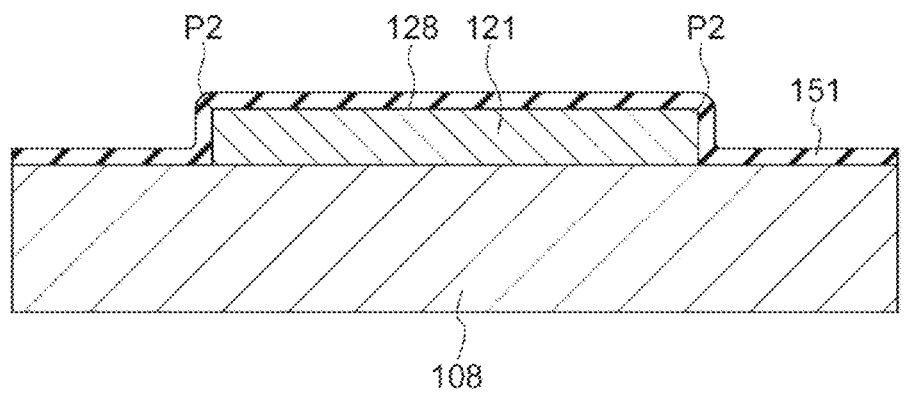
Figure 7C:
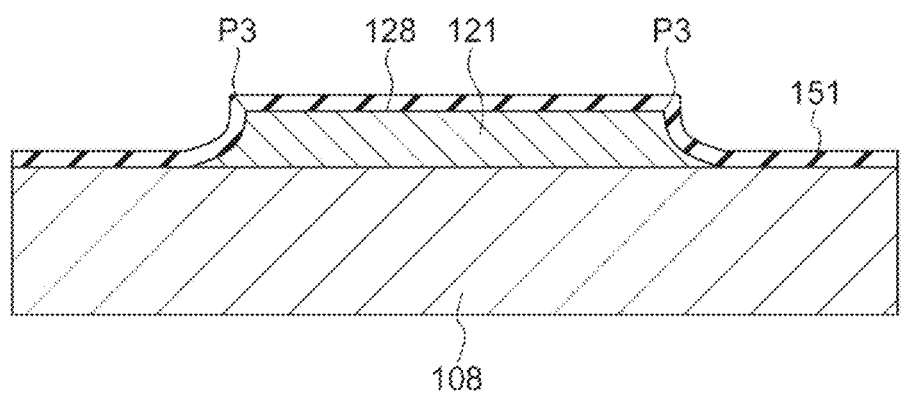

FIG. 6 is a photomicrograph showing a cross-section of a fabricated first wiring. The first wiring 21 with such a cross-sectional shape can be formed by photolithography, dry etching, or wet etching. For example, when photolithography is used, a three-dimensionally rounded resist pattern can be formed by using a gray scale mask or baking a photoresist. By transferring this resist pattern to a silicon substrate, a desired wiring shape can be obtained.

As illustrated in FIG. 4, the second wiring 31A is provided inside the insulation layer 51. That is, the second wiring 31A is provided on the support portion 5 and the second connection portion 7 with the insulation layer 51 interposed therebetween. The second wiring 31A is formed so as to have, for example, a rectangular cross-sectional shape.

As illustrated in FIG. 5, the movable portion 6 is provided with a groove portion 55 having a shape corresponding to the coil 12. The inner surface of the groove portion 55 is provided with the insulation layer 51. The seed layer 56 is provided on the insulation layer 51 inside the groove portion 55. The seed layer 56 is formed of, for example, titanium nitride. The coil 12 is disposed inside the groove portion 55 with the insulation layer 51 and the seed layer 56 interposed therebetween. The coil 12 is formed by embedding a metal material such as copper in the groove portion 55 by, for example, a damascene method. The insulation layer 52 is provided so as to cover the coil 12 disposed inside the groove portion 55. The second wiring 31B has, for example, the same cross-sectional shape as that of the second wiring 31A and is provided on the insulation layer 52. That is, the second wiring 31B is provided on the movable portion 6 with the insulation layers 51 and 52 interposed therebetween. The second wiring 31B is electrically connected to the coil 12 through an opening provided in the insulation layer 52 so as to expose the inner end of the coil 12. The insulation layer 53 is provided on the second wiring 31B.

A groove portion 13 is formed along a boundary between the seed layer 56 and the surface on the side of the insulation layer 52 in the coil 12 when forming the coil 12. The insulation layer 52 includes a groove portion 52a at a position corresponding to the groove portion 13 in the surface opposite to the movable portion 6. The groove portion 52a is formed such that a part of the insulation layer 52 enters the groove portion 13 when forming the insulation layer 52. The insulation layer 53 includes a groove portion 53a at a position corresponding to the groove portion 52a in the surface opposite to the movable portion 6. The groove portion 53a is formed such that a part of the insulation layer 53 enters the groove portion 52a when forming the insulation layer 53.

In the actuator device 1, when a current flows to the coil 11, a Lorentz force is generated in a predetermined direction on electrons flowing in the coil 11 by the magnetic field generated in the magnetic field generator 3. Accordingly, the coil 11 receives a force in a predetermined direction. For this reason, the support portion 5 can be swung around the second axis X2 by controlling the direction or magnitude of the current flowing through the coil 11. Similarly, the movable portion 6 can be swung around the first axis X1 by controlling the direction or magnitude of the current flowing through the coil 12. Thus, it is possible to swing the mirror 2 around each of the first axis X1 and the second axis X2 which are orthogonal to each other by controlling the direction or magnitude of each of the coil 11 and the coil 12. Further, the movable portion 6 can be swung at a high speed of a resonance frequency level by flowing a current having a frequency corresponding to the resonance frequency of the movable portion 6 to the coil 12. In this case, the first connection portion 8 disposed on the inside (on the side of the mirror 2) swings at a high speed as compared with the second connection portion 7 disposed on the outside.

In the above-described actuator device 1, the first wiring 21 provided on the first connection portion 8 includes the first main body 26 formed of the first metal material having a Vickers hardness of 50 HV or more. Accordingly, it is possible to decrease the resistance of the first wiring 21 as compared with a case in which the entire first wiring 21 is formed by the diffusion layer and to suppress the metal fatigue as compared with a case in which the entire first wiring 21 is formed of a metal material of which a Vickers hardness is less than 50 HV. Further, the second surface 28 of the first main body 26 has a shape in which a curvature is continuous over the entire second surface 28 in a cross-section perpendicular to the extension direction of the first wiring 21. Accordingly, since there is no point in which a curvature is discontinuous in the second surface 28, the occurrence of stress concentration is suppressed. As a result, the occurrence of the brittle fracture of the first wiring 21 can be suppressed.

Figure 8:
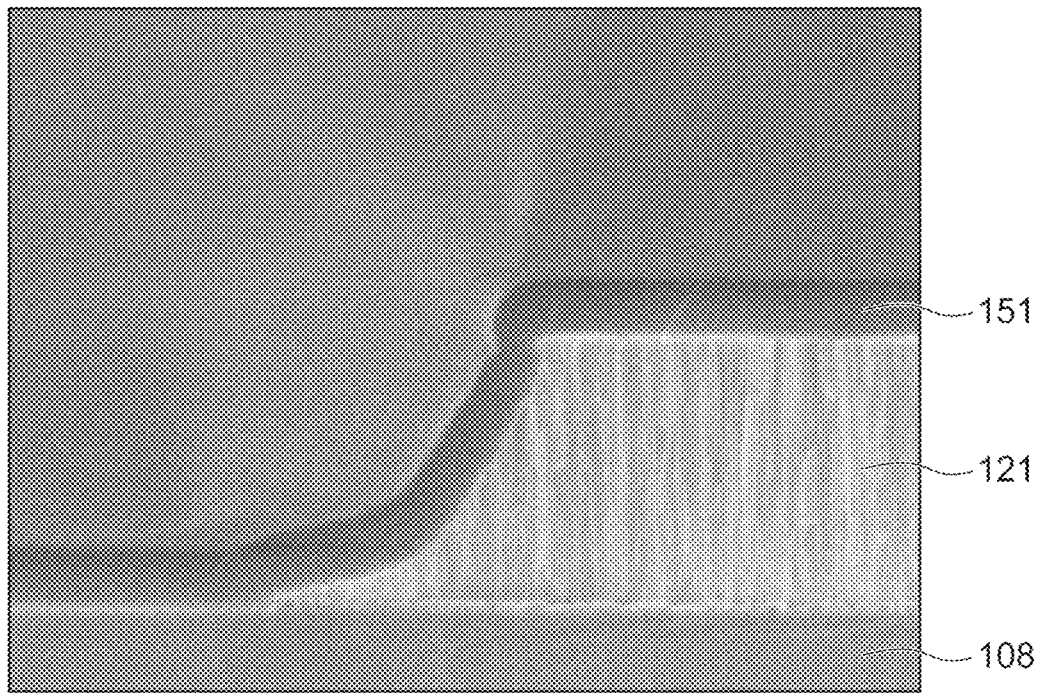
FIG. 8 is a photomicrograph showing a cross-section of a fabricated wiring of the third comparative example.

Here, the superiority in a case in which the discontinuous curvature does not exist in the second surface 28 of the first wiring 21 will be further described with reference to FIGS. 7A, 7B, 7C, and 8. In the first, second, and third comparative examples illustrated in FIGS. 7A to 7C, a wiring 121 corresponding to the first wiring 21 is provided on a connection portion 108 corresponding to the first connection portion 8. An insulation layer 151 corresponding to the insulation layer 51 is provided on the connection portion 108 and the wiring 121. Also in any one of the first to third comparative examples, the top surface 128 of the wiring 121 (the surface other than the surface facing the connection portion 108) has points P1, P2 and P3 in which a curvature is discontinuous. The points P1 to P3 are apexes of sharp corners. The points P1 to P3 are formed at the connection point between the flat portions or the connection point between the flat portion and the curved portion. The point in which the curvature is discontinuous may be formed in a connection point between the curved portions. FIG. 8 is a photomicrograph showing a cross-section of the fabricated wiring of the third comparative example. The wiring 121 with such a cross-sectional shape is formed by, for example, the same method as that of the first wiring 21 of the embodiment.

When the points P1 to P3 having discontinuous curvatures exist in the top surface 128 of the wiring 121 as in the first to third comparative examples, the top surface 128 is likely to be chipped or scratched and stress concentration easily occurs at that position in the process of manufacturing the actuator device or the like. That is, when an external force is applied to the points P1 to P3, for example, during etching for forming the wiring or handling in the manufacturing process, the portion may be chipped or scratched. In this case, there is a possibility that brittle fracture may occur due to stress concentration on the portion in which chipping or scratching occurs when the movable portion swings. In contrast, in the actuator device 1, since the second surface 28 of the first wiring 21 has a shape in which a curvature is continuous on the whole, the occurrence of stress concentration can be suppressed.

Thus, according to the actuator device 1, the reliability can be improved while decreasing the resistance of the first wiring 21 provided on the first connection portion 8 and suppressing the metal fatigue thereof. Additionally, there are following disadvantages when the first wiring 21 is formed by a damascene wiring embedded in a groove as in the coil 12. First, copper is generally used as a material for damascene wiring. However, since the Vickers hardness of copper is less than 50 HV, metal fatigue tends to occur in the wiring. For this reason, there is a possibility that a spring constant becomes non-linear due to plastic deformation, controllability deteriorates due to hysteresis behavior and work hardening, and characteristics change with time. Further, in the damascene wiring, since corners are formed in the groove portions and a plurality of points with discontinuous curvatures exist on the surface in the groove portions, stress concentration is likely to occur.

In the actuator device 1, the second surface 28 includes the curved portion 28b which is curved so as to protrude toward a side opposite to the first connection portion 8 in a cross-section perpendicular to the extension direction of the first wiring 21. Accordingly, it is possible to further decrease the resistance of the first wiring 21 by securing the cross-sectional area of the first wiring 21 while suppressing the brittle fracture in the first wiring 21. That is, in the actuator device 1, the cross-sectional area of the first wiring 21 is large as compared with, for example, a case in which the curved portion 28b is curved so as to protrude toward the first connection portion 8.

In the actuator device 1, the second surface 28 intersects the first surface 27 so as to form an acute angle in a cross-section perpendicular to the extension direction of the first wiring 21. Accordingly, since the stress concentration of the intersection portion between the second surface 28 and the first surface 27 can be suppressed, the reliability can be further improved.

In the actuator device 1, the diffusion layer 8b having impurities diffused therein is formed in the first connection portion 8 so as to contact the first wiring 21. Accordingly, since the diffusion layer 8b serves as a part of the first wiring 21, the resistance of the first wiring 21 can be further decreased.

In the actuator device 1, the first main body 26 is formed of at least one of tungsten, titanium, nickel, molybdenum, aluminum alloy, tungsten alloy, titanium alloy, nickel alloy, and stainless steel. Accordingly, the above-described effect that the reliability can be improved while decreasing the resistance of the first wiring 21 provided on the first connection portion 8 and suppressing the metal fatigue thereof can be suitably obtained.

In the actuator device 1, the first wiring 21 further includes the seed layer 25 provided between the first connection portion 8 and the first main body 26. Accordingly, the adhesion of the first main body 26 to the first connection portion 8 can be improved.

In the actuator device 1, the seed layer 25 is formed of a metal material having a Vickers hardness of 50 HV or more. Accordingly, the occurrence of the metal fatigue and the brittle fracture of the seed layer 25 can be suppressed.

In the actuator device 1, the second wiring 31A provided on the support portion 5 is formed of a second metal material having a Vickers hardness less than 50 HV. Accordingly, for example, when a material having a low specific resistance is used as the second metal material, the resistance of the second wiring 31A provided on the support portion 5 can be decreased.

In the actuator device 1, the movable portion 6 is provided with the mirror 2. Accordingly, the mirror 2 can be swung around the first axis X1 to be used for light scanning or the like.

Although one embodiment of the invention has been described above, the invention is not limited to the above-described embodiment. For example, the materials and shapes of each component are not limited to the materials and shapes described above and various materials and shapes can be employed.

Figure 9A:
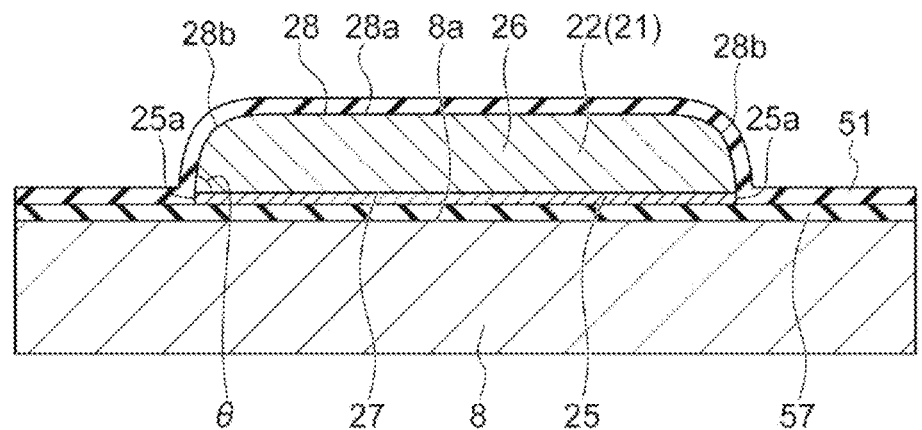
FIGS. 9A and 9B are schematic cross-sectional views of first and second modified examples.
Figure 9B:
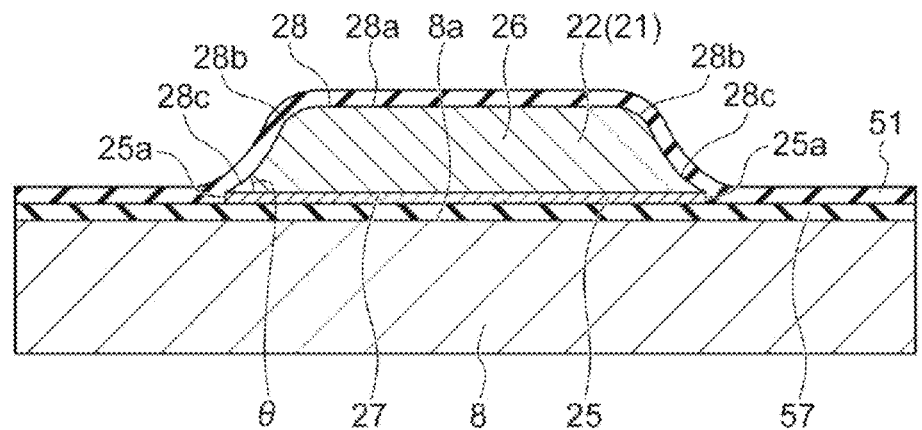

The first wiring 21 may be formed as in the first and second modified examples illustrated in FIGS. 9A and 9B. In the first and second modified examples, the diffusion layer 8b is not formed and the insulation layer 57 is provided on the first connection portion 8. The first wiring 21 is provided on the insulation layer 57. That is, the first wiring 21 is provided on the first connection portion 8 with the insulation layer 57 interposed therebetween. The first surface 27 of the first main body 26 faces the first connection portion 8 with the seed layer 25 and the insulation layer 57 interposed therebetween. Also in any one of the first modified example and the second modified example, the second surface 28 of the first main body 26 has a shape in which a curvature is continuous over the entire second surface 28 in a cross-section perpendicular to the extension direction of the first wiring 21. In the first modified example, an angle θ formed by the second surface 28 and the first surface 27 is, for example, about 45° to 90°. In the second modified example, the second surface 28 further includes a curved portion 28c which is curved so as to protrude toward the first connection portion 8 in addition to the flat portion 28a and the curved portion 28b in the cross-section. In the second modified example, an angle θ formed by the second surface 28 and the first connection portion 8 is, for example, about 45° or less. Also in the first and second modified examples, it is possible to improve reliability while decreasing the resistance of the first wiring 21 provided on the first connection portion 8 and suppressing the metal fatigue thereof similarly to the above-described embodiment.

When the above-described embodiment is compared with the first and second modified examples, in the above-described embodiment, the angle θ formed by the second surface 28 and the first surface 27 is smaller than that of the case of the first modified example. Accordingly, it is possible to further suppress stress concentration on the intersection portion between the second surface 28 and the first surface 27 as compared with the first modified example. Further, in the above-described embodiment, since the curved portion 28b extends to the intersection portion between the second surface 28 and the first surface 27, a region provided with the curved portion 28b is wider than the second modified example on the assumption that the height of the first main body 26 is the same. Accordingly, since the cross-sectional area of the first wiring 21 can be increased, a decrease in resistance can be realized. Meanwhile, when the first modified example and the second modified example are compared with each other, in the first modified example, the angle θ is larger than that of the second modified example. Accordingly, since the cross-sectional area of the first wiring 21 can be increased as compared with the second modified example, a decrease in resistance can be realized. In contrast, in the second modified example, since the angle θ is smaller than that of the first modified example, the stress concentration on the intersection portion between the second surface 28 and the first surface 27 can be suppressed as compared with the first modified example. Further, in the second modified example, since the curved portions 28b and 29c are provided, stress can be distributed.

Figure 10:
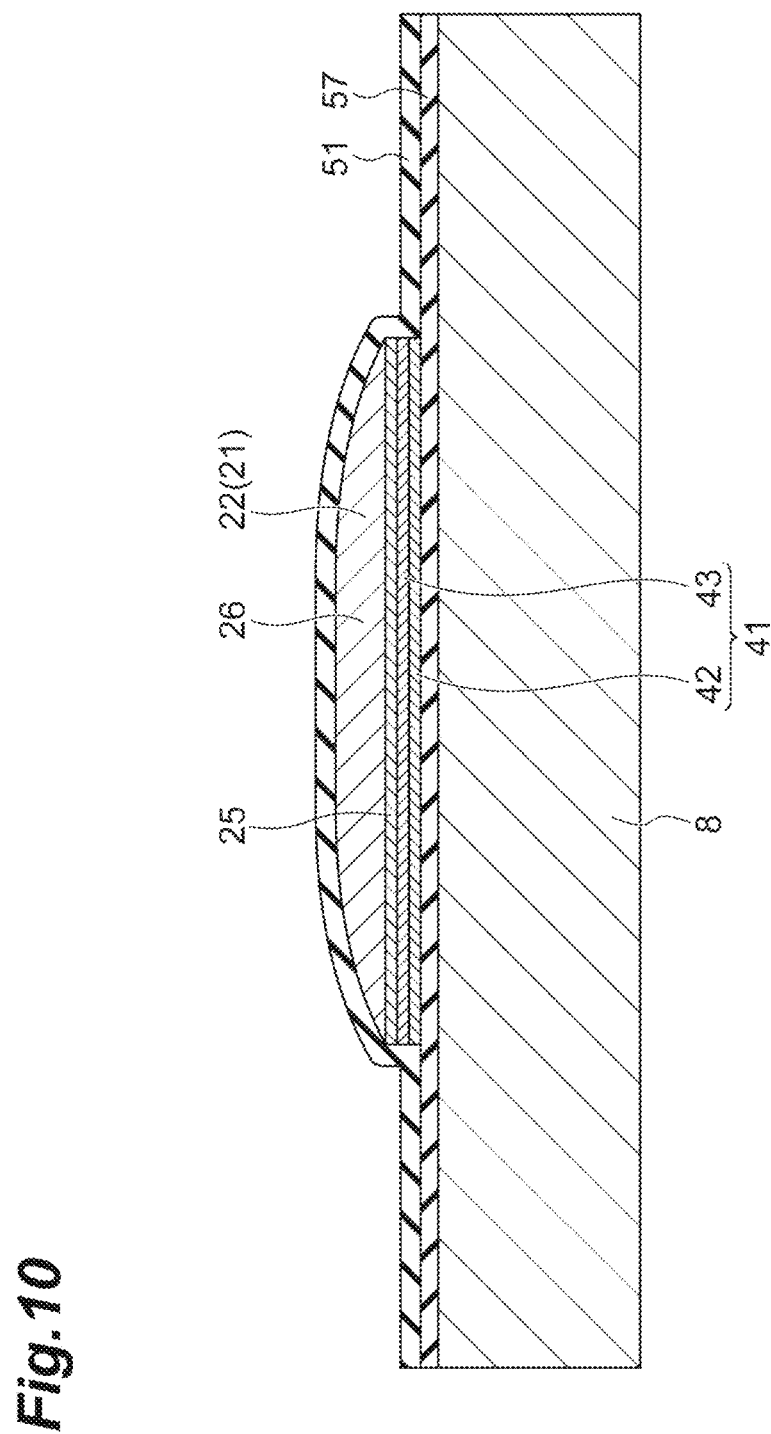
FIG. 10 is a schematic cross-sectional view of a third modified example.

As in the third modified example illustrated in FIG. 10, the actuator device 1 may further include a barrier layer 41. In the third modified example, the first main body 26 is formed of an aluminum alloy, a tungsten alloy, a titanium alloy, a nickel alloy, or stainless steel and the first main body 26 contains a metal material having a high diffusion coefficient (for example, zinc (Zn) or copper). In order to suppress the diffusion of the metal material, the barrier layer 41 is provided on the insulation layer 57 and the first wiring 21 is provided on the barrier layer 41. That is, the barrier layer 41 is provided between the first connection portion 8 and the first wiring 21. The barrier layer 41 is formed of a metal material or an insulation material having a Vickers hardness of 50 HV or more. The material forming the barrier layer 41 is, for example, titanium, titanium nitride, or tungsten. In this example, the barrier layer 41 includes a first layer 42 provided on the insulation layer 57 and a second layer 43 provided on the first layer 42. For example, the first layer 42 is formed of titanium and the second layer 43 is formed of titanium nitride (TiN) or tungsten. The second layer 43 is a layer mainly having a barrier function. Also in the third modified example, similarly to the above-described embodiment, it is possible to improve reliability while decreasing the resistance of the first wiring 21 provided on the first connection portion 8 and suppressing the metal fatigue thereof. Further, it is possible to suppress the diffusion of the metal material contained in the first main body 26 to the first connection portion 8. Further, the occurrence of the metal fatigue and the brittle fracture in the barrier layer 41 can be suppressed. Additionally, the first layer 42 may be omitted and the second layer 43 may be directly provided on the insulation layer 57.

Figure 11:
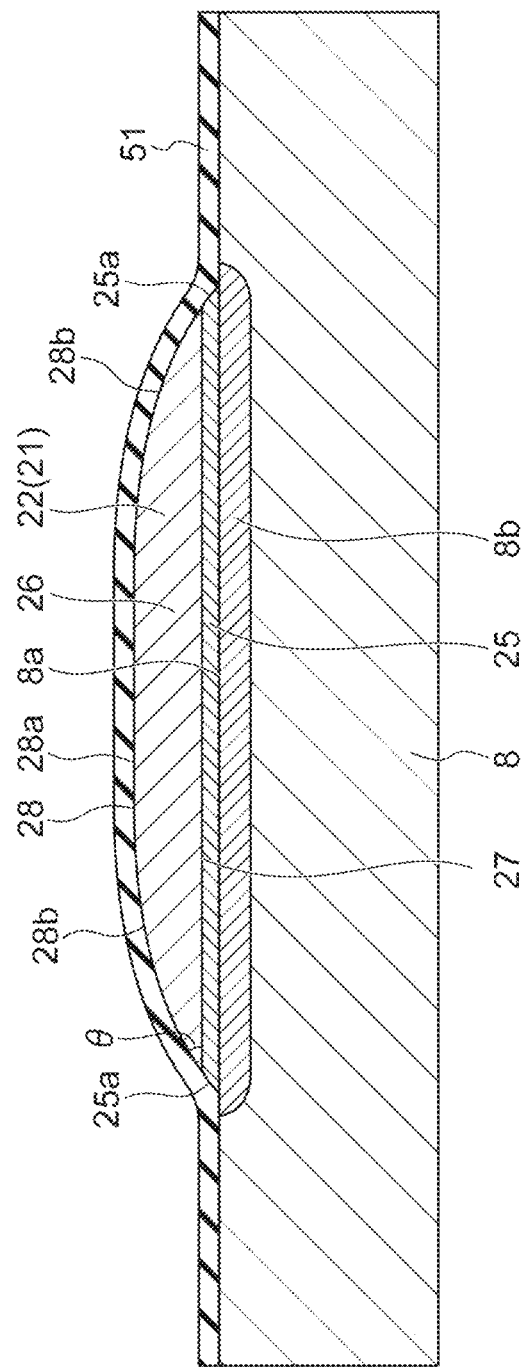
FIG. 11 is a schematic cross-sectional view of a fourth modified example.

Similarly to the fourth modified example illustrated in FIG. 11, the seed layer 25 may be formed. In the fourth modified example, a curvature of the boundary portion between the second surface 28 of the first wiring 21 and the surface 25a of the seed layer 25 is continuous in a cross-section (a cross-section illustrated in FIG. 11) perpendicular to the extension direction of the first wiring 21 (the direction parallel to the first axis X1). The surface 25a has a shape in which a curvature is continuous over the entire surface 25a in the cross-section. That is, in the first wiring 21, the second surface 28 of the first main body 26 and the surface 25a of the seed layer 25 have a shape in which a curvature is continuous in all of the second surface 28 and the surface 25a in the cross-section. The surface 25a intersects the first connection portion 8 so as to form an acute angle in the cross-section. An angle formed by the surface 25a and the first connection portion 8 (an angle of an inner corner formed by the surface 25a and the first connection portion 8) is, for example, about 45° or less. Also in such a fourth modified example, similarly to the above-described embodiment, the reliability can be improved while decreasing the resistance of the first wiring 21 provided on the first connection portion 8 and suppressing the metal fatigue thereof. Further, since the stress concentration of the boundary portion between the second surface 28 and the surface 25a can be suppressed, the reliability can be further improved.

In the above-described embodiment, the wiring (hereinafter, referred to as the third wiring) provided on each second connection portion 7 may be formed similarly to the first wiring 21. In this case, the third wiring includes, for example, a portion located on the second connection portion 7 in the wirings 14a and 14b and a portion located on the second connection portion 7 in the second wirings 31A and 31B and is electrically connected to the wirings 14a and 14b or the second wirings 31A and 31B. The third wiring includes a second main body formed of a metal material having a Vickers hardness of 50 HV or more. As the metal material forming the third wiring, a material exemplified as the first metal material can be used. The second main body of the third wiring includes a third surface facing the second connection portion 7 and a fourth surface other than the third surface. The fourth surface has a shape in which a curvature is continuous over the entire fourth surface in a cross-section perpendicular to the extension direction of the third wiring. According to the modified example, the reliability can be improved while decreasing the resistance and suppressing the metal fatigue also in the third wiring provided on the second connection portion 7. Also in the third wiring, similarly to the first wiring 21, the "cross-section perpendicular to the extension direction of the third wiring" means a cross-section perpendicular to the extension direction of each portion when the third wiring includes a plurality of portions extending in different directions. For example, the extension direction of the third wiring on the linear portion 7a is a direction along the linear portion 7a. The extension direction of the third wiring on the linear folded portion 7b is a direction along the folded portion 7b. The extension direction of the third wiring on the folded portion 7b curved in an R shape is a direction (circumferential direction) along the folded portion 7b.

The actuator device 1 may be used to drive a component other than the mirror 2. The shape of the mirror 2 is not limited to the circular shape. The mirror 2 may have, for example, a rectangular shape, a rhombus shape, an oval shape, or the like. In the above-described embodiment, the swinging (driving) of the mirror 2 is performed by an electromagnetic force, but may be performed by, for example, a piezoelectric element. In this case, a wiring for applying a voltage to a piezoelectric element is provided instead of the coils 11 and 12. The magnetic field generator 3 may be omitted. The first axis X1 and the second axis X2 may not be orthogonal to each other or intersect each other. The actuator device 1 may swing only around the first axis X1. In this case, the frame portion 4 and the second connection portion 7 may be omitted and the electrode to be electrically connected to the control circuit and the like may be provided in the support portion 5.

The first wiring 21 may not include the second portion 23 and the third portion 24 and the entire first wiring 21 may be formed linearly. The second surface 28 may not include the flat portion 28a and may have, for example, a curved shape on the whole. Each second connection portion 7 may be formed linearly. The seed layer 25 may be formed of a metal material of which a Vickers hardness is less than 50 HV. The second surface 28 of the first main body 26 and the surface 25a of the seed layer 25 may be formed such that a curvature in a boundary portion therebetween is discontinuous in a cross-section perpendicular to the extension direction of the first portion 22. Similarly to the first wiring 21, the third wiring may include the seed layer provided in the second connection portion 7 and the second main body provided on the seed layer. In this case, at least the second main body may be formed of a metal material having a specific resistance smaller than that of the metal material forming the first main body 26 of the first wiring 21 and/or a metal material having a Vickers hardness of 50 HV or more.

In the above-described embodiment, the movable portion 6 may be provided with an electromotive force monitoring coil (sensing coil) for measuring an electromotive force or a temperature sensing coil (sensing coil) for measuring a temperature. The sensing coil may have the same configuration as that of the first wiring 21 and may be electrically connected to the first wiring provided on the first connection portion 8. Alternatively, in the above-described embodiment, the coil 12 may not be used only as the driving coil for driving the movable portion 6, but may be also used as the sensing coil. The coil 12 may not be used as the driving coil, but may be used as the sensing coil only. Similarly, the sensing coil may be provided on the support portion 5 to be electrically connected to the third wiring provided on the second connection portion 7 and the coil 11 may not be used only as the driving coil, but may be also used as the sensing coil.

REFERENCE SIGNS LIST

1: actuator device, 5: support portion, 6: movable portion, 7: second connection portion, 8: first connection portion, 8b: diffusion layer, 21: first wiring, 25: seed layer, 25a: surface, 26: first main body, 27: first surface, 28: second surface, 28b: curved portion, 31A: second wiring, 41: barrier layer, X1: first axis, X2: second axis.

The invention claimed is:

1. An actuator device comprising:
a support portion;
a movable portion;
a first connection portion connecting the movable portion to the support portion on a first axis so that the movable portion is swingable around the first axis;
a first wiring provided on the first connection portion; and
a first insulation layer provided on at least the first connection portion,
wherein the first wiring includes a first main body formed of a metal material,
wherein the first insulation layer includes a part provided on the first wiring,
wherein a surface of the part of the first insulation layer on a side opposite to the first connection portion has a shape in which a curvature is continuous over an entirety of the surface in a cross-section perpendicular to an extension direction of the first wiring.

2. The actuator device according to claim 1,
wherein the surface of the part of the first insulation layer includes a curved portion curved to protrude toward a side opposite to the first connection portion in a cross-section perpendicular to the extension direction of the first wiring.

3. The actuator device according to claim 2,
wherein the surface of the part of the first insulation layer includes a plurality of the curved portion in a cross-section perpendicular to the extension direction of the first wiring.

4. The actuator device according to claim 3,
wherein the surface of the part of the first insulation layer further includes a flat portion interposed between the plurality of the curved portion in a cross-section perpendicular to the extension direction of the first wiring.

5. The actuator device according to claim 1,
wherein the first insulation layer further includes an additional part provided on a region on the first insulation layer other than the region where the first wiring is provided, and the part provided on the first wiring is continuously formed with the additional part.

6. The actuator device according to claim 5,
wherein a surface of the first insulation layer on the first connection portion on a side opposite to the first connection portion has a shape in which a curvature is continuous over an entirety of the surface in a cross-section perpendicular to the extension direction of the first wiring.

7. The actuator device according to claim 1,
wherein the first main body includes a first surface facing the first connection portion and a second surface other than the first surface, and
wherein the second surface intersects the first surface so as to form an acute angle in a cross-section perpendicular to the extension direction of the first wiring.

8. The actuator device according to claim 1,
wherein the first main body includes a first surface facing the first connection portion and a second surface other than the first surface, and
wherein the second surface intersects the first surface so as to form a right angle in a cross-section perpendicular to the extension direction of the first wiring.

9. The actuator device according to claim 1,
wherein the first main body includes a first surface facing the first connection portion and a second surface other than the first surface, and
wherein the second surface has a shape in which a curvature is continuous over the entire second surface in a cross-section perpendicular to the extension direction of the first wiring.

10. The actuator device according to claim 1,
wherein the first main body includes a first surface facing the first connection portion and a second surface other than the first surface, and
wherein the second surface includes a point where a curvature is discontinuous in a cross-section perpendicular to the extension direction of the first wiring.

11. The actuator device according to claim 1,
wherein the metal material forming the first main body has a Vickers hardness of 50 HV or more.

12. The actuator device according to claim 1, further comprising:
a frame portion supporting the support portion and the movable portion;
a second connection portion connecting the support portion to the frame portion on a second axis so that the support portion is swingable around the second axis intersecting the first axis;
a second wiring provided on the second connection portion, and
a second insulation layer provided on at least the second connection portion,
wherein the second wiring includes a second main body formed of a metal material,
wherein the second insulation layer includes a second part provided on the second wiring,
wherein a surface of the second part of the second insulation layer on a side opposite to the second connection portion has a shape in which a curvature is continuous over an entirety of the surface in a cross-section perpendicular to an extension direction of the second wiring.

13. The actuator device according to claim 12,
wherein the first insulation layer is integrally formed with the second insulation layer.

* * * * *